(12) United States Patent
Stamper

(10) Patent No.: US 6,297,149 B1
(45) Date of Patent: Oct. 2, 2001

(54) METHODS FOR FORMING METAL INTERCONNECTS

(75) Inventor: Anthony K. Stamper, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/412,708

(22) Filed: Oct. 5, 1999

(51) Int. Cl.[7] .............................................. H01L 21/4763
(52) U.S. Cl. ........................ 438/637; 438/689; 438/700
(58) Field of Search .................................... 438/689, 712, 438/638, 618, 637, 634, 736, 695, 700; 257/774

(56) References Cited

U.S. PATENT DOCUMENTS

| | | | |
|---|---|---|---|
| 4,789,648 | | 12/1988 | Chow et al. ......................... 438/633 |
| 5,612,254 | * | 3/1997 | Mu et al. ............................. 438/634 |
| 5,614,765 | | 3/1997 | Avanzino et al. ................... 257/774 |
| 5,635,423 | * | 6/1997 | Huang et al. ........................ 438/638 |
| 5,686,354 | * | 11/1997 | Avanzino et al. ..................... 216/18 |
| 5,705,430 | | 1/1998 | Avanzino et al. ................... 438/618 |
| 5,736,457 | | 4/1998 | Zhao .................................... 438/624 |
| 5,739,579 | * | 4/1998 | Chiang et al. ....................... 257/635 |
| 5,741,626 | * | 4/1998 | Jain et al. ............................ 430/314 |
| 5,795,823 | | 8/1998 | Avanzino et al. ................... 438/639 |
| 5,801,094 | | 9/1998 | Yew et al. ........................... 438/624 |
| 5,821,169 | * | 10/1998 | Nguyen et al. ...................... 438/736 |
| 5,877,076 | * | 3/1999 | Dai ....................................... 438/597 |
| 5,883,006 | * | 3/1999 | Iba ....................................... 438/712 |
| 5,985,753 | * | 11/1999 | Yu et al. .............................. 438/637 |
| 6,025,259 | * | 2/2000 | Yu et al. .............................. 438/618 |
| 6,057,239 | * | 5/2000 | Wang et al. ......................... 438/689 |

FOREIGN PATENT DOCUMENTS

WO 99/33102 * 7/1999 (WO) .

OTHER PUBLICATIONS

D. Cote et al., "Boron Nitride Self–Aligned Stud/Dual Damascene Process", IBM Technical Disclosure Bulletin, vol. 34, No. 9, pp. 6–8 (Feb. 1992).

* cited by examiner

Primary Examiner—Eddie C. Lee
Assistant Examiner—José R. Diaz
(74) Attorney, Agent, or Firm—Dugan & Dugan; Howard J. Walter, Jr.; Robert Curcio

(57) ABSTRACT

Methods for forming metal interconnects are provided. An insulating layer is formed on top of a substrate and a via is formed in the insulating layer reaching to the substrate. The via then is filled with a sacrificial material and a trench aligned over the via is formed by removing an upper portion of the insulating layer and an upper portion of the sacrificial material within the trench. The sacrificial material preferably is selected to etch faster than the insulating layer. After forming the trench, remaining sacrificial material in the via is removed and the via and the trench are filled with a conductive material. In addition to a single insulating layer, the insulating layer on top of the substrate may comprise a first insulating layer formed on top of the substrate, an etch stop layer formed on top of the first insulating layer and a second insulating layer formed on top of the etch stop layer. A barrier layer may be formed within the via after via formation and prior to filling the via with a sacrificial material so as to prevent lateral etching of the via during removal of sacrificial material therefrom.

25 Claims, 8 Drawing Sheets

METHODS FOR FORMING METAL INTERCONNECTS

FIELD OF THE INVENTION

The present invention relates to semiconductor integrated circuits and more specifically to methods for forming metal interconnects within semiconductor integrated circuits.

BACKGROUND OF THE INVENTION

A typical integrated circuit contains a plurality of metal pathways to provide electrical power for powering the various semiconductor devices comprising the integrated circuit, and to allow these semiconductor devices to share/exchange electrical information. Within integrated circuits, metal layers are stacked on top of one another by using intermetal or "interlayer" dielectrics that insulate the metal layers from each other. Typically, however, each metal layer must form electrical contact to an additional metal layer.

Metal-layer-to-metal-layer electrical contact is achieved by etching a hole (i.e., a via) in the interlayer dielectric that separates the metal layers to be connected, and by filling the resulting hole or via with a metal (creating an "interconnect"). In a conventional dual damascene process, a "line" or trench is first etched in the interlayer dielectric followed by the formation of a via therein (i.e., a line first dual damascene process). Both the line and the via then are filled with a metal to create an interconnect.

Because variations in line density across a semiconductor chip produce thickness variations in the photoresist ("resist") used to image vias during a line first dual damascene process, the reproducible production of small vias across a semiconductor chip is difficult using conventional line first dual damascene processes. One method for overcoming this problem is to partially or completely etch each via prior to line formation, and to thereafter re-mask, define and etch each line (i.e., a via first dual damascene process). However, removing line imaging resist (and/or anti-reflective coating) from vias is difficult, especially for high aspect ratio vias (e.g., vias having aspect ratios that exceed three). Any residual line imaging resist remaining within a via blocks contact to the underlying metal layer and degrades/inhibits interconnect formation. Accordingly, a need exists for methods for forming improved metal interconnects.

SUMMARY OF THE INVENTION

To address the needs of the prior art, inventive methods for forming metal interconnects are provided. An insulating layer is formed on top of a substrate (e.g., a substrate having a metal line formed therein) and a via is formed in the insulating layer reaching to the substrate. The via then is filled with a sacrificial material and a trench aligned over the via is formed by removing an upper portion of the insulating layer and an upper portion of the sacrificial material within the trench. The sacrificial material preferably is selected to etch faster than the insulating layer. After forming the trench, remaining sacrificial material in the via is removed and the via and the trench are filled with a conductive material.

In addition to a single insulating layer, the insulating layer on top of the substrate may comprise a first insulating layer formed on top of the substrate, an etch stop layer formed on top of the first insulating layer and a second insulating layer formed on top of the etch stop layer. In this manner, the trench aligned over the via may be formed by removing a section of the second insulating layer and an upper portion of the sacrificial material within the trench (e.g., by using the etch stop layer during removal of the section of the second insulating layer). A barrier layer may be formed within the via after via formation and prior to filling the via with a sacrificial material so as to prevent lateral etching of the via during removal of sacrificial material therefrom.

By employing a sacrificial "filler" material within the via, via formation may be performed prior to trench (e.g., line) formation without residual line imaging resist or anti-reflective coating remaining within the via. Therefore, low resistance dual damascene interconnects employing high aspect ratio vias may be reproducibly formed.

Other objects, features and advantages of the present invention will become more fully apparent from the following detailed description of the preferred embodiments, the appended claims and the accompanying drawings.

BRIEF DESCRIPTION OF THE DRAWINGS

The present invention is described with reference to the accompanying drawings. In the drawings, like reference numbers indicate identical or functionally similar elements. Additionally, the left-most digit of a reference number identifies the drawing in which the reference number first appears.

DETAILED DESCRIPTION OF THE PREFERRED EMBODIMENTS

Figure 1:
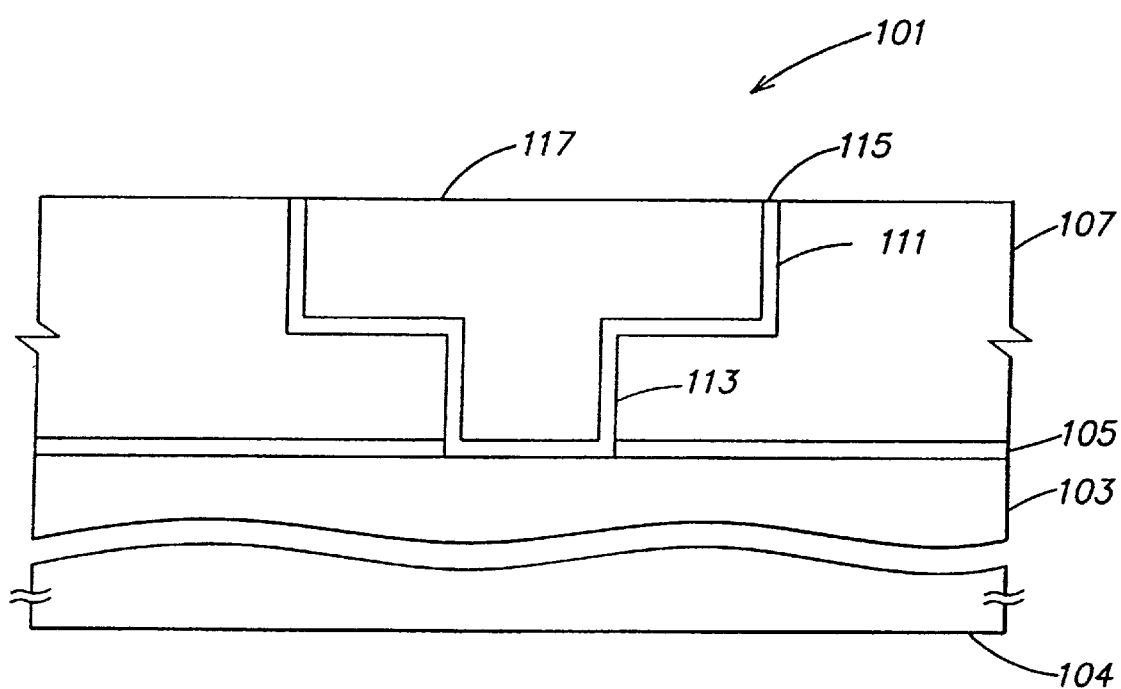
FIG. 1 is a cross-sectional diagram illustrating a first metal interconnect fabricated using a first novel fabrication method in accordance with the present invention.

FIG. 1 is a cross-sectional diagram illustrating a first metal interconnect 101 fabricated using a first novel fabrication method in accordance with the present invention. The first metal interconnect 101 comprises a metal line 103 (e.g., a copper or an aluminum damascene or dual damascene structure) formed in a semiconductor substrate 104 (e.g., a silicon substrate) and having a first silicon nitride layer 105 formed thereon. An interlayer dielectric layer 107 is formed on the first silicon nitride layer 105.

A line 111 is formed in an upper portion of the interlayer dielectric layer 107, and a via 113 is formed within the line 111 and through the interlayer dielectric layer 107 and the first silicon nitride layer 105 so as to expose the metal line 103 (enabling contact to be made thereto). A conductive barrier layer (or barrier layers) 115 (e.g., titanium, tantalum, tungsten or nitridized alloys of all three metals) is formed within the line 111 and the via 113, and the line 111 and the via 113 are filled with a 30 conductive material 117 (e.g., copper or aluminum) to complete the first metal interconnect 101. Note that the first silicon nitride layer 105 and the barrier layer 115 are not required if the metal line 103 and the conductive material 117 are aluminum.

As described below with reference to FIGS. 2A–G, the first novel fabrication method for forming the first metal interconnect 101 allows the interconnect 101 to be formed using a via first dual damascene process without residual line imaging resist (and/or anti-reflective coating if employed) remaining within the via 113. Therefore, the first metal interconnect 101 has low resistance even when the via 113 is a high aspect ratio via (e.g., has an aspect ratio greater than three).

Figure 2A:
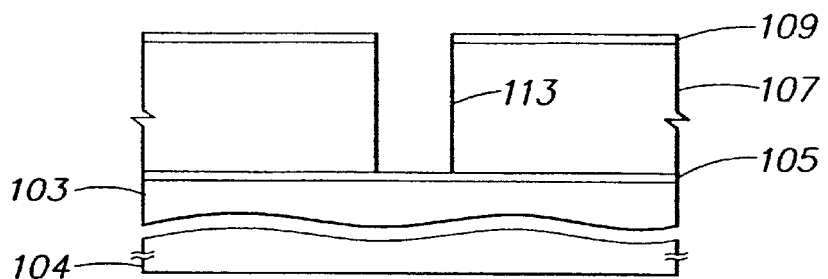
FIGS. 2A–G are cross-sectional illustrations of a first novel fabrication method used to fabricate the first metal interconnect of FIG. 1.

FIGS. 2A–G are cross-sectional illustrations of the first novel fabrication method used to fabricate the first metal interconnect 101 of FIG. 1. With reference to FIG. 2A, the metal line 103 is formed within the semiconductor substrate 104 by conventional methods, and the first silicon nitride layer 105 is deposited on the metal line 103. If the metal line 103 comprises copper, then the first silicon nitride layer 105 preferably is deposited to a thickness of about 10–100 nanometers, and most preferably to a thickness of about 50 nanometers, and serves as a diffusion barrier which prevents copper atoms in the metal line 103 from diffusing into the interlayer dielectric layer 107. This silicon nitride layer also acts as an etch stop to prevent over etching during the subsequent via etching (described below) and also allows for the removal of the via photoresist without exposing the metal line 103 to the photoresist strip process. The first silicon nitride layer 105 may be deposited using any known technique such as plasma enhanced chemical vapor deposition (PECVD).

The interlayer dielectric layer 107 (e.g., silicon dioxide) is deposited (e.g., using PECVD) on the first silicon nitride layer 105 to a thickness of about 100–2000 nanometers, and most preferably to a thickness of 500 nanometers. A second silicon nitride layer 109 is optionally deposited (e.g., using PECVD) to a thickness of about 50 nanometers on top of the interlayer dielectric layer 107 to act as a polish stop as described below. Assuming the second silicon nitride layer 109 is present, an opening in the second silicon nitride layer 109 is photolithographically defined, and the via 113 is etched within the interlayer dielectric layer 107 to expose the first silicon nitride layer 105 as is known in the art.

Figure 2B:
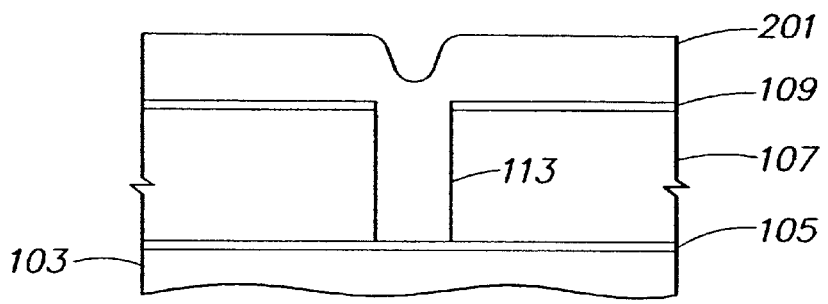

Following formation of the via 113, the via 113 is filled with a sacrificial material ("filler layer 201") as shown if FIG. 2B. The filler layer 201 may comprise a variety of materials including but not limited to spun-on flowed oxide (FOX) (e.g., a hydrogen silesquioxane based spin-on glass (SOG) material), a standard SOG material (e.g., undoped, phosphorous doped or boron doped SOG), PECVD deposited $B_2O_3$, or phosphorosilica glass (PSG) or borosilica glass (BSG) deposited via a thermal chemical vapor deposition (THCVD) process (e.g., employing ozone, TEOS, and TEPO or TEB as is known in the art). The particular material used as the filler layer 201 preferably etches faster than the interlayer dielectric layer 107 during a filler layer removal step (described below).

If the filler layer 201 is a spun-on film, the preferred thickness for the filler layer 201 is about 50° of the height of the via 113, since spun-on films are more sensitive to via height. Likewise, if the filler layer 201 is a deposited film, the preferred thickness for the filler layer 201 is about 60% of the width of the via 113, since deposited films are more sensitive to via width.

Figure 2C:
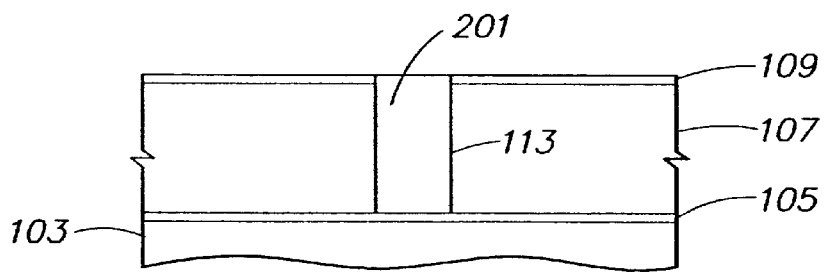

Following filling of the via 113 with the filler layer 201, the filler layer 201 is planarized via a chemical mechanical polishing (CMP) step as shown in FIG. 2C.

Specifically, the filler layer 201 is chemically-mechanically removed from the top of the second silicon nitride layer 109, which acts as a polish stop, so only the portion of the filler layer 201 which fills the via 113 remains. Any suitable CMP process known in the art may be employed to planarize the filler layer 201.

Figure 2D:
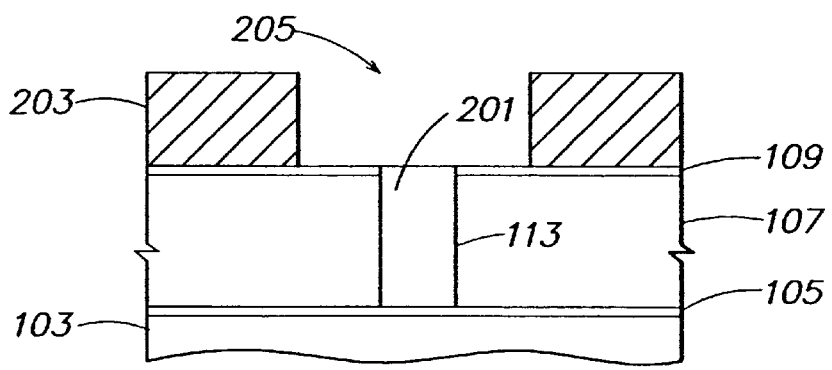
Figure 2E:
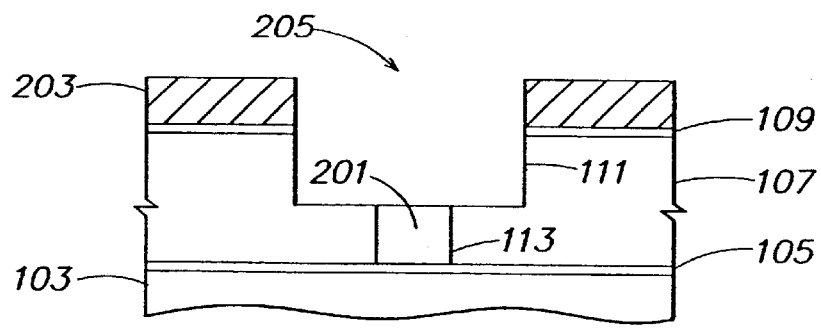

As shown in FIG. 2D, following planarization of the filler layer 201, a layer of photoresist 203 is deposited on top of the second silicon nitride layer 109 to a thickness of about 300–1200 nanometers, is exposed, and is developed to form a line imaging resist pattern 205. Note that any conventional photolithographic techniques may be employed to define the line imaging resist pattern 205. Thereafter, the line 111 is defined within an upper portion of the interlayer dielectric layer 107 by etching through the line imaging resist pattern 205 as shown in FIG. 2E. Specifically, a section of the second silicon nitride layer 109 and an upper portion of both the interlayer dielectric layer 107 and the filler layer 201 are removed. Preferably reactive ion etching (e.g., perfluorocarbon based) through the line imaging resist pattern 205 is performed to form the line 111 having a height ranging from about 300–1200 nanometers, and most preferably having a height of about 500 nanometers.

Figure 2F:
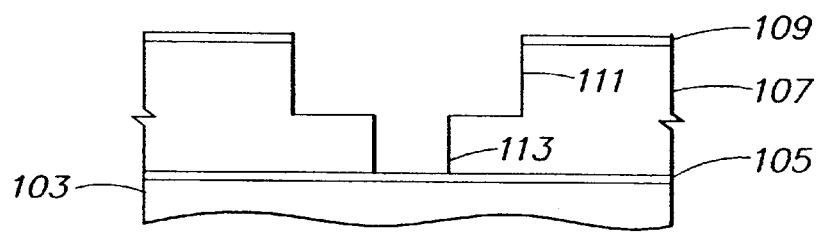

Following formation of the line 111, the lower portion of the filler layer 201 that remains within the via 113 is removed (FIG. 2F). For example, if the filler layer 201 comprises FOX, PSG or SOG, a dilute hydrofluoric acid solution may be used (typically 100:1 DI:HF) to etch the filler layer 201 from the via 113. If the filler layer 201 comprises $B_2O_3$ or BSG, a hot phosphoric acid solution may be employed to etch the filler layer 201 from the via 113. The photoresist 203 also is removed.

Figure 2G:
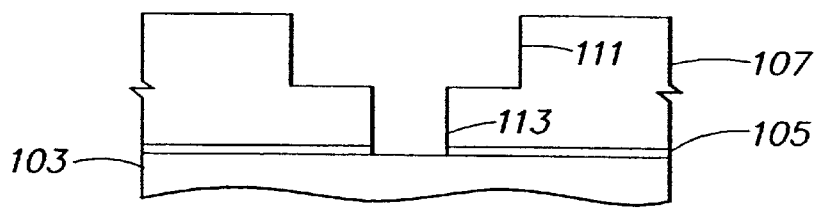

Following removal of the filler layer 201 and the photoresist 203, the exposed portion of the first silicon nitride layer 105 is etched from the via 113 (e.g., by reactive-ion etching) to expose the metal line 103 as shown in FIG. 2G. The second silicon nitride layer 109 also is removed during this etch step. To complete the first metal interconnect 101 of FIG. 1, the via 113 and the line 111 are filled with the conductive material 117. Note that if the conductive material 117 comprises copper, the barrier layer 115 is formed within the via 113 and the line 111 prior to filling both with the conductive material 117.

By employing a sacrificial "filler" material (e.g., filler layer 201) within the via 113, via formation may be performed prior to line formation without residual line imaging resist (or anti-reflective coating if employed) remaining within the via 113. Therefore, low resistance dual damascene interconnects employing high aspect ratio vias may be reproducibly formed.

Figure 3:
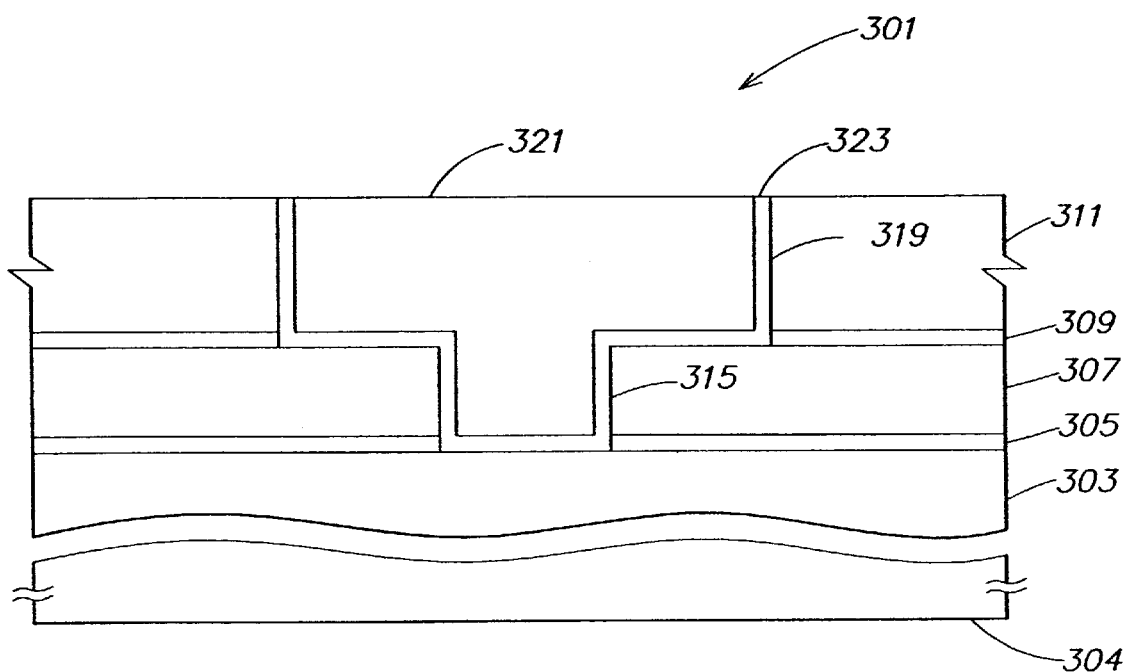
FIG. 3 is a cross-sectional illustration of a second metal interconnect illustrating alternative embodiments of the present invention.

FIG. 3 is a cross-sectional diagram of a second metal interconnect 301 illustrating a first alternative embodiment of the present invention. As with the first metal interconnect 101, the second metal interconnect 301 comprises a metal line 303 formed in a semiconductor substrate 304 and having a first silicon nitride layer 305 formed thereon. However, unlike the single interlayer dielectric layer 107 of the first metal interconnect 101, the second metal interconnect 301 comprises a multilayer interlayer dielectric layer having a first interlayer dielectric layer 307 formed on the first silicon nitride layer 305, an etch stop layer (e.g., second silicon nitride layer 309) formed on the first interlayer dielectric layer 307, and a second interlayer dielectric layer 311 formed on the second silicon nitride layer 309.

A via 315 is formed through the second interlayer dielectric layer 311, the second silicon nitride layer 309, the first interlayer dielectric layer 307 and the first silicon nitride layer 305 to expose the metal line 303. A portion of the second interlayer dielectric layer 311 also is removed to form a line 319 therein, and the line 319 and the via 315 are filled with a conductive material 321 (e.g., copper or aluminum) to complete the second metal interconnect 301. If the conductive material 321 comprises copper, preferably a barrier layer 323 (e.g., titanium, tantalum, tungsten or nitridized alloys of all three metals) is formed over the sidewalls and bottom of the via 315 and the line 319 as shown.

Figure 4A:
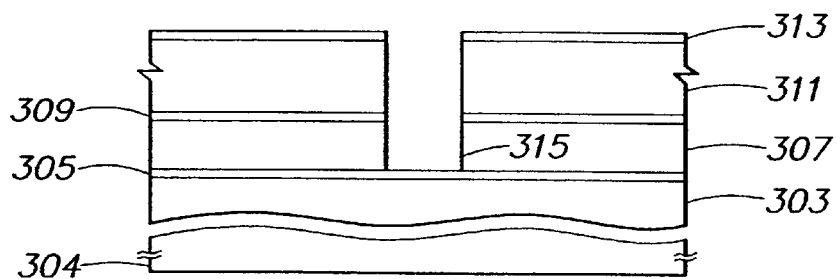
FIGS. 4A–G are cross-sectional illustrations of a second novel fabrication method used to fabricate the second metal interconnect of FIG. 3.

FIGS. 4A–G are cross-sectional illustrations of a second novel fabrication method used to fabricate the metal interconnect 301 of FIG. 3. With reference to FIG. 4A, the metal line 303 is formed within the semiconductor substrate 304 by conventional methods and the first silicon nitride layer 305 is deposited on the metal line 303 (in a manner similar to the metal line 103 and the first silicon nitride layer 105 described with reference to FIG. 2A). Thereafter, the first interlayer dielectric layer 307 is deposited on the first silicon nitride layer 305, the second silicon nitride layer 309 is deposited on the first interlayer dielectric layer 307 and the second interlayer dielectric layer 311 is deposited on the second silicon nitride layer 309. The second silicon nitride layer 309 preferably has a thickness of about 10–100 nanometers, most preferably about 50 nanometers, and is "positioned" to define the desired height of the line 319 by serving as an etch stop for the removal of the second interlayer dielectric layer 311 during formation of the line 319 (described below).

Figure 4B:
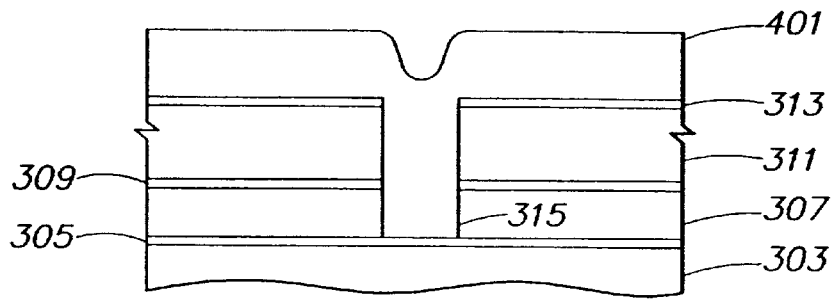
Figure 4C:
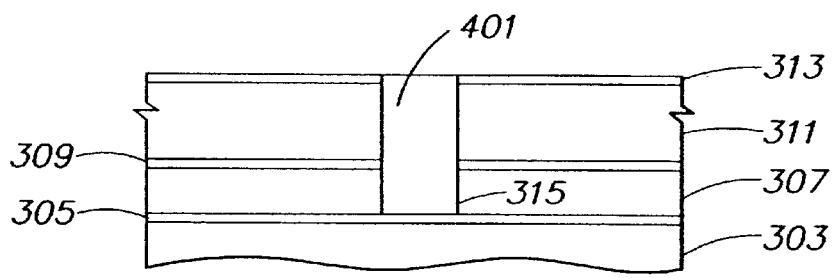
Figure 4D:
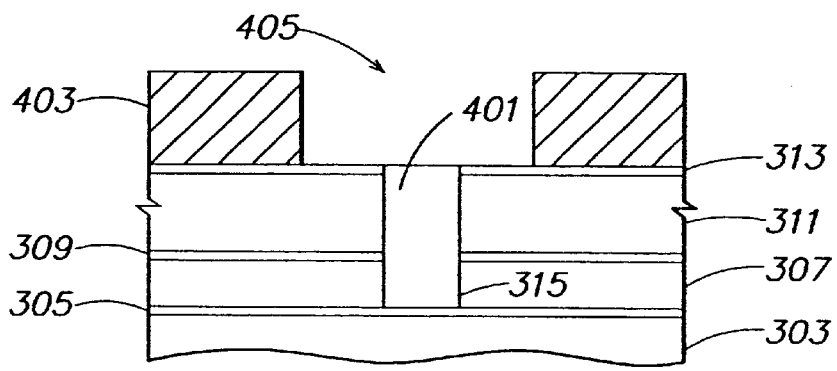

Following deposition of the second interlayer dielectric layer 311, a third silicon nitride layer 313 is deposited over the second interlayer dielectric layer 311 and the via 315 is etched (e.g., by reactive ion etching) through the layers 307–313 to expose the first silicon nitride layer 305. Thereafter, the via 315 is filled with a sacrificial material ("filler layer 401") as shown in FIG. 4B. As with the filler layer 201 of FIG. 2B, the filler layer 401 of FIG. 4B preferably comprises a material that etches faster than the interlayer dielectric layers 307, 311 such as FOX, $B_2O_3$, PSG or BSG (with a similar thickness to the filler layer 201). Thereafter the filler layer 401 is planarized (e.g., via CMP) as shown in FIG. 4C; and a layer of photoresist 403 is deposited on the third silicon nitride layer 313 and on the filler layer 401, is exposed and is developed to form a line imaging resist pattern 405 as shown in FIG. 4D.

Figure 4E:
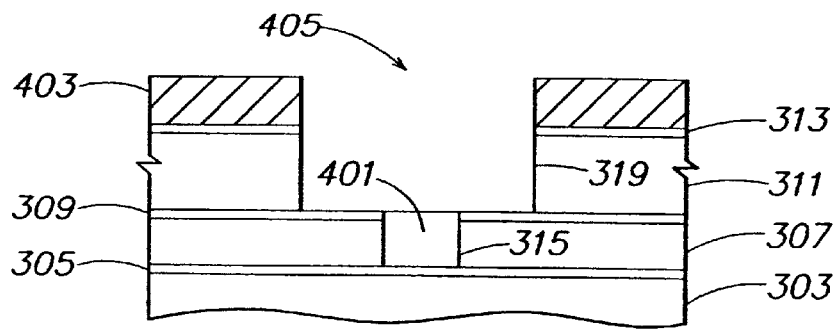
Figure 4F:
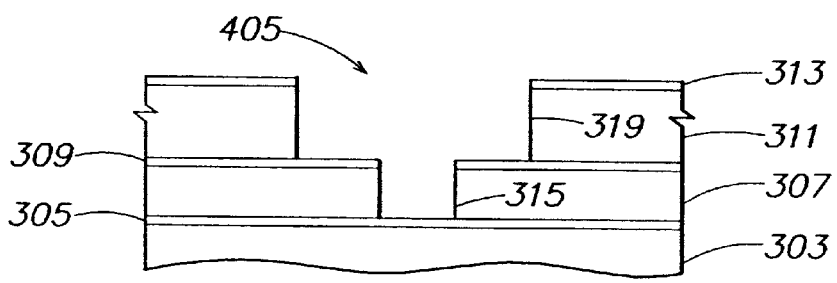

With the line imaging resist pattern 405 present, the line 319 is formed by etching through the pattern 405 as shown in FIG. 4E. Specifically, a section of the third silicon nitride layer 313 and the second interlayer dielectric layer 311, as well as an upper portion of the filler layer 401, are removed (e.g., via reactive ion etching). Note that the height of the line 319 is defined by the position of the second silicon nitride layer 309 which serves as an etch stop.

Figure 4G:
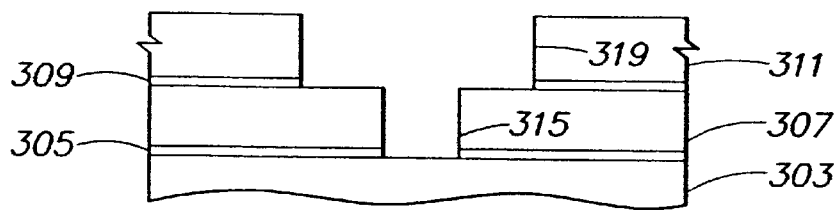

Following formation of the line 319, the lower portion of the filler layer 401 that remains within the via 315 is removed (FIG. 4F) as described with reference to FIG. 2E. The photoresist 403 also is removed. Thereafter, the exposed portion of the first silicon nitride layer 305 is etched from the via 315 as shown in FIG. 4G. The third silicon nitride layer 313 also is removed during this step.

The second metal interconnect 301 is completed by filling the line 319 and the via 315 with the conductive material 321. If the conductive material 321 comprises copper, preferably a barrier layer 323 (e.g., titanium or tantalum nitride) is deposited within the line 319 and the via 315 prior to filling the line 319 and the via 315 with the conductive material 321.

The foregoing description discloses only the preferred embodiments of the invention, modifications of the above disclosed apparatus and method which fall within the scope of the invention will be readily apparent to those of ordinary skill in the art. For instance, while the various materials and material layer thicknesses described herein are preferred other materials and material layer thicknesses may be similarly employed. Any suitable semiconductor fabrication processes such as etching, deposition, chemical-mechanical polishing, photolithography and the like may be employed to form interconnects in accordance with the present invention.

Figure 5A:
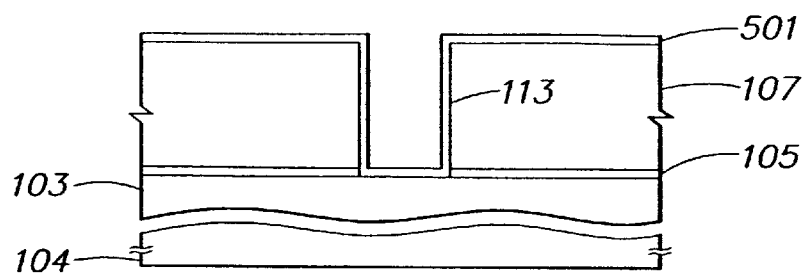
FIGS. 5A–G are cross-sectional illustrations of an alternative fabrication method for fabricating the metal interconnect of FIG. 1 or the metal interconnect of FIG. 3.

For example, FIGS. 5A–G are cross-sectional illustrations of an alternative fabrication method for fabricating the metal interconnect 101 of FIG. 1 or the metal interconnect 301 of FIG. 3. For convenience, only the fabrication of the metal interconnect 101 is described herein. With reference to FIG. 5A, the metal line 103 is formed within the semiconductor substrate 104 and the first silicon nitride layer 105 is deposited on the metal line 103. Thereafter, the interlayer dielectric layer 107 is deposited on the first silicon nitride layer 105.

Following deposition of the interlayer dielectric layer 107, the via 113 is etched (e.g., via reactive ion etching) through the layers 105–107 to expose the metal line 103. Thereafter, a barrier layer 501 is deposited (e.g., via a physical vapor deposition process such as sputter deposition) over the interlayer dielectric layer 107 and the sidewalls and bottom of the via 113. Preferably the barrier layer 501 comprises $Si_xN_yH_x$ or $Si_xC_yH_z$ deposited to a thickness of about 5–100 nanometers, most preferably to about 20 nanometers.

Figure 5B:
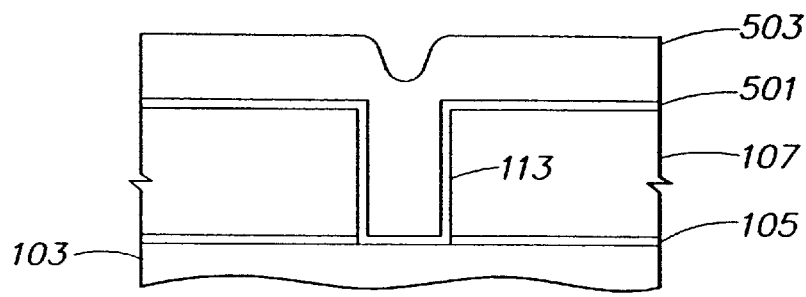
Figure 5C:
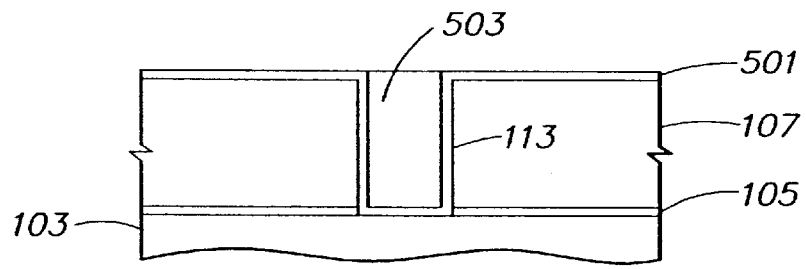
Figure 5D:
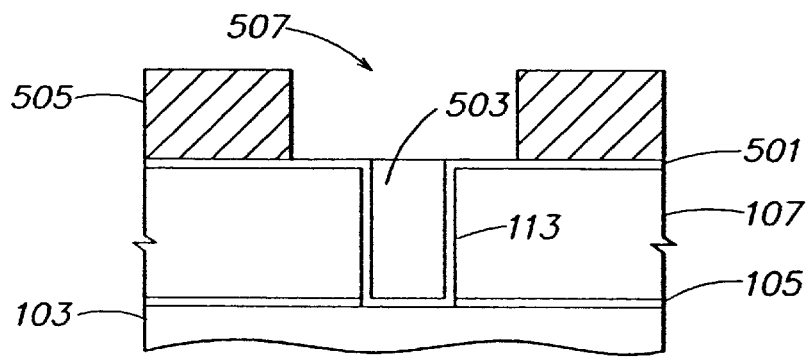

After deposition of the barrier layer 501, the via 113 is filled with a sacrificial material ("filler layer 503") as shown in FIG. 5B. The filler layer 503 of FIG. 5B preferably comprises a material that etches faster than the interlayer dielectric layer 107 such as FOX, $B_2O_3$, PSG or BSG. Thereafter the filler layer 503 is planarized (e.g., via CMP) as shown in FIG. 5C; and a layer of photoresist 505 is deposited on the barrier layer 501 and on the filler layer 503, is exposed and is developed to form a line imaging resist pattern 507 as shown in FIG. 5D.

Figure 5E:
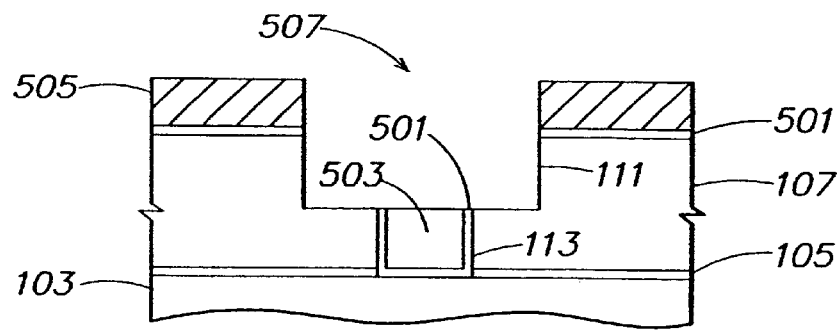
Figure 5F:
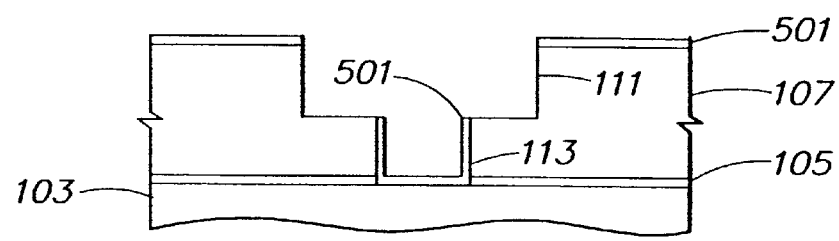

With the line imaging resist pattern 507 present, the line 111 is formed by etching through the pattern 507 as shown in FIG. 5E. Specifically, a section of the barrier layer 501 and the interlayer dielectric layer 107, as well as an upper portion of the filler layer 503, are removed (e.g., via reactive ion etching).

Figure 5G:
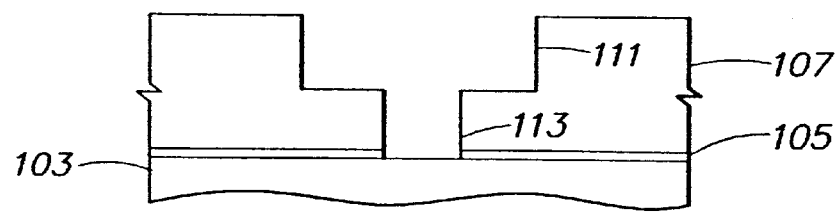

Following formation of the line 111, the photoresist 505 is removed and the lower portion of the filler layer 503 that remains within the via 113 is removed (FIG. 5F) as previously described. Advantageously, the presence of the barrier layer 501 on the sidewalls of the via 113 prevents lateral etching of (e.g., undercutting of the bottom of) the via 113 during removal of the filler layer 501. Tighter control over via dimensionality thereby is maintained. After removal of the filler layer 503, the barrier layer 501 is removed (e.g., via reactive ion etching) as shown in FIG. 5G. The metal interconnect 101 is completed by filling the line 111 and the via 113 with the conductive material 117. Preferably the barrier layer 115 is employed for a copper interconnect. While the present invention has been described with reference to via-first, trench-second (line-second) dual damascene processes, it will be understood that the invention also may be used with trench-first (line-first), via-second dual damascene processes.

Accordingly, while the present invention has been disclosed in connection with the preferred embodiments thereof, it should be understood that other embodiments may fall within the spirit and scope of the invention, as defined by the following claims.

The invention claimed is:

1. A method of fabricating a semiconductor device comprising the steps of:
   providing a substrate;
   forming an insulating layer on top of said substrate;
   forming a via reaching to said substrate in said insulating layer;
   filling said via with a sacrificial material;
   planarizing said sacrificial material such that said sacrificial material is present only within said via;
   forming a trench aligned over said via by removing an upper portion of said insulating layer and an upper portion of said sacrificial material within said trench;
   removing remaining sacrificial material in said via; and
   filling said via and said trench with a conductive material.

2. The method of claim 1 wherein providing a substrate comprises providing a substrate having a metal line formed therein.

3. The method of claim 2 wherein the metal line comprises a metal selected from the group consisting of aluminum and copper.

4. The method of claim 1 wherein providing a substrate comprises providing a substrate having a metal line formed therein and a diffusion barrier layer formed on the metal line and wherein forming a via reaching to said substrate comprises forming a via reaching to the diffusion barrier layer.

5. The method of claim 4 wherein the diffusion barrier layer comprises silicon nitride.

6. The method of claim 1 wherein forming an insulating layer on top of said substrate comprises forming a silicon dioxide layer on top of said substrate.

7. The method of claim 1 wherein filling said via with a sacrificial material comprises filling said via with a material that etches faster than said insulating layer.

8. The method of claim 7 wherein said sacrificial material comprises a material selected from the group consisting of hydrogen silesquoxane, $B_2O_3$, undoped spin-on glass, phosphorus doped spin-on glass, boron doped spin-on glass, phosphorosilica glass and borosilica glass.

9. The method of claim 1 wherein removing remaining sacrificial material in said via comprises etching remaining sacrificial material in said via.

10. The method of claim 9 wherein etching remaining sacrificial material in said via comprises etching remaining sacrificial material in said via with an etch selected from the group consisting of dilute hydrofluoric acid and hot phosphoric acid.

11. The method of claim 1 wherein filling said via and said trench with a conductive material comprises filling said via and said trench with a conductive material selected from the group consisting of aluminum and copper.

12. The method of claim 1 further comprising forming a polish stop layer on said insulating layer prior to via formation.

13. The method of claim 12 wherein said polish stop layer comprises silicon nitride.

14. The method of claim 1 further comprising depositing a barrier layer in said via and in said trench prior to filling said via and said trench with a conductive material.

15. The method of claim 14 wherein the barrier layer comprises a material selected from the group consisting of titanium, titanium nitride, tantalum, tantalum nitride, tungsten and tungsten nitride.

16. The method of claim 1 wherein forming an insulating layer on top of said substrate comprises:
    forming a first insulating layer on top of said substrate;
    forming an etch stop layer on top of said first insulating layer; and
    forming a second insulating layer on top of said etch stop layer; and
    wherein forming a trench aligned over said via by removing an upper portion of said insulating layer and an upper portion of said sacrificial material within said trench comprises forming a trench aligned over said via by removing a section of said second insulating layer and an upper portion of said sacrificial material within said trench.

17. The method of claim 16 wherein the etch stop layer comprises silicon nitride.

18. The method of claim 1 further comprising forming a barrier layer within said via after via formation and prior to filling said via with a sacrificial material so as to prevent lateral etching of said via during the removal of said sacrificial material from said via.

19. The method of claim 18 wherein the barrier layer comprises a metal layer.

20. The method of claim 19 wherein the metal layer comprises a material selected from the group consisting of titanium, titanium nitride, tantalum, tantalum nitride, tungsten and tungsten nitride.

21. A method of fabricating a semiconductor device comprising the steps of:
    providing a substrate;
    forming a metal line on said substrate;
    forming a diffusion barrier layer on said metal line;
    forming an insulating layer on top of said diffusion barrier layer;
    forming a via reaching to said diffusion barrier layer in said insulating layer;
    filling said via with a sacrificial material;
    planarizing said sacrificial material such that said sacrificial material is present only within said via;
    forming a trench aligned over said via by removing an upper portion of said insulating layer and an upper portion of said sacrificial material within said trench;
    removing remaining sacrificial material in said via;
    depositing a barrier layer in said via and said trench; and,
    filling said via and said trench with a conductive material.

22. The method of claim 21 wherein the metal line comprises a metal selected from the group consisting of aluminum and copper.

23. The method of claim 21 wherein the diffusion barrier layer comprises silicon nitride.

24. The method of claim 21 wherein forming an insulating layer on top of said substrate comprises forming a silicon dioxide layer on top of said substrate.

25. The method of claim 21 wherein said sacrificial material comprises a material that is a deposited film.

* * * * *